(12) United States Patent
Hopperton et al.

(10) Patent No.: US 9,750,156 B2
(45) Date of Patent: Aug. 29, 2017

(54) DEVICE AND SYSTEM FOR THE DISTRIBUTION OF CABLING IN DATA CENTER ENVIRONMENTS

(71) Applicant: Drop Point Systems, Inc., Carlsbad, CA (US)

(72) Inventors: Mark Hopperton, Ramona, CA (US); Michael P. Cardinal, Ramona, CA (US)

(73) Assignee: DROP POINT SYSTEMS, INC., Carlsbad, CA (US)

( * ) Notice: Subject to any disclaimer, the term of this patent is extended or adjusted under 35 U.S.C. 154(b) by 0 days.

(21) Appl. No.: 15/158,809

(22) Filed: May 19, 2016

(65) Prior Publication Data

US 2016/0345458 A1 Nov. 24, 2016

Related U.S. Application Data

(60) Provisional application No. 62/165,605, filed on May 22, 2015, provisional application No. 62/296,517, filed on Feb. 17, 2016.

(51) Int. Cl.
*A47F 7/00* (2006.01)
*H05K 7/14* (2006.01)
(Continued)

(52) U.S. Cl.
CPC ......... *H05K 7/1491* (2013.01); *A47F 7/0035* (2013.01); *F16L 3/1226* (2013.01);
(Continued)

(58) Field of Classification Search
CPC ...... H05K 7/1491; F16L 3/1226; F16L 3/223; F16L 5/00; F16L 3/00; F16L 3/02; F16L 3/12; F16L 3/1222; F16L 3/22; F16L 3/26; A47B 2097/003; A47B 2097/006; A47B 81/007; H04Q 1/06; H04Q 1/064;
(Continued)

(56) References Cited

U.S. PATENT DOCUMENTS 944,731 A * 12/1909 Gold ...................... F16L 3/2235
16/DIG. 39
4,179,033 A * 12/1979 Mitchell ................. A47F 7/175
211/189

(Continued)

*Primary Examiner* — Jennifer E Novosad
(74) *Attorney, Agent, or Firm* — Procopio, Cory, Hargreaves & Savitch LLP

(57) ABSTRACT

System for distributing cabling. In an embodiment, a unit comprises two levels. Each level comprises openings, on two opposing surfaces, arranged in a row parallel to a first axis, with each opening opposite to one opening on the opposing surface. Each level comprises parallel main conduits between the surfaces. Each main conduit is angled relative to a second axis, intersecting the surfaces and orthogonal to the first axis, such that each main conduit connects an opening on one surface to an opening on the other surface that is offset by one opening from its opposing opening on the other surface. A divergent conduit connects openings on one of the two surfaces to an opening on a third surface, and an articulated conduit, angled relative to a third axis that is orthogonal to the first and second axes, connects an opening on one level to an opening on the other level.

20 Claims, 16 Drawing Sheets

(51) Int. Cl.
  *F16L 3/223* (2006.01)
  *F16L 3/12* (2006.01)
  *H04Q 1/06* (2006.01)
  *F16L 5/00* (2006.01)
  *H02G 3/06* (2006.01)
  *H02G 3/34* (2006.01)
  *A47B 97/00* (2006.01)

(52) U.S. Cl.
  CPC ............. *F16L 3/223* (2013.01); *F16L 5/00* (2013.01); *H02G 3/06* (2013.01); *H02G 3/34* (2013.01); *H04Q 1/064* (2013.01); *A47B 2097/003* (2013.01)

(58) Field of Classification Search
  CPC ........ H04Q 1/066; H04Q 1/068; H04Q 1/062; A47F 7/0028; A47F 7/0035; A47F 7/0021; A47F 7/28; A47F 7/283; H02G 3/04; H02G 3/0406; H02G 3/263; H02G 3/26; H02G 3/0462; H02G 3/0481; H02G 3/34; H02G 3/06
  USPC .......... 211/26, 60.1, 70.8, 70.2, 59.4, 85.18; 285/61; 248/49, 65, 51, 56, 57, 67.5, 248/67.7, 71, 73
  See application file for complete search history.

(56) References Cited

U.S. PATENT DOCUMENTS

| | | | | |
|---|---|---|---|---|
| 4,655,668 A * | 4/1987 | Perisastry | ............... | F42B 39/22 206/3 |
| 5,025,934 A * | 6/1991 | Vogel | ................... | A47F 7/0028 211/60.1 |
| 5,277,006 A * | 1/1994 | Ruster | .................. | H02G 3/288 174/497 |
| 5,615,850 A * | 4/1997 | Cloninger | ................ | F16L 3/22 211/26 |
| 5,649,633 A * | 7/1997 | Bellerose | ............. | A63C 11/028 211/60.1 |
| 5,655,671 A * | 8/1997 | Barry | .................... | A47F 7/0021 211/163 |
| 5,836,130 A * | 11/1998 | Unruh | ..................... | F16L 3/223 248/68.1 |
| 6,540,312 B1 * | 4/2003 | Lane | .................... | H05K 7/1449 211/26 |
| 6,702,237 B2 * | 3/2004 | Rubenstein | .............. | H02G 3/30 248/49 |
| 6,857,606 B1 * | 2/2005 | Gretz | ...................... | F16L 3/223 248/68.1 |
| 6,946,605 B2 * | 9/2005 | Levesque | ............. | H05K 7/1491 174/100 |
| 7,022,916 B1 * | 4/2006 | Cavanaugh | .......... | H05K 7/1491 174/100 |
| 7,036,668 B2 * | 5/2006 | Udy | ......................... | B25H 3/04 211/60.1 |
| 7,077,688 B2 * | 7/2006 | Peng | ....................... | H02G 3/32 248/68.1 |
| 7,098,406 B1 * | 8/2006 | Hammonds | ............ | B65H 75/06 174/135 |
| D586,204 S * | 2/2009 | Robbins, III | .................. | D8/380 |
| 7,534,958 B2 * | 5/2009 | McNutt | ................ | G02B 6/3897 174/101 |
| 7,922,012 B2 * | 4/2011 | Sisley | .................. | H02G 3/0406 211/26 |
| 8,133,049 B1 * | 3/2012 | Sullivan | ................ | F27D 5/0012 211/188 |
| 8,221,169 B2 * | 7/2012 | Ahmed | ................ | G02B 6/4459 361/826 |
| 8,464,985 B2 * | 6/2013 | Mulch | ...................... | H02G 3/30 174/664 |
| 8,881,475 B2 * | 11/2014 | Lewis | ....................... | E04B 5/48 248/49 |
| 2004/0120133 A1 * | 6/2004 | Nguyen | ............... | H05K 7/1491 361/825 |
| 2005/0133472 A1 * | 6/2005 | Deye | ....................... | F42B 4/20 211/60.1 |
| 2011/0277579 A1 * | 11/2011 | Anderson | ................ | B25J 9/104 74/490.04 |
| 2014/0291456 A1 * | 10/2014 | Rego | ...................... | F16L 3/221 248/69 |
| 2015/0036992 A1 * | 2/2015 | Fleming | ................. | H02G 3/045 385/135 |
| 2015/0187460 A1 * | 7/2015 | DeLoache | ............ | H02G 3/305 248/68.1 |
| 2016/0043536 A1 * | 2/2016 | Rixen | .................... | H02G 3/045 248/73 |
| 2016/0345458 A1 * | 11/2016 | Hopperton | ........... | H05K 7/1491 |

* cited by examiner

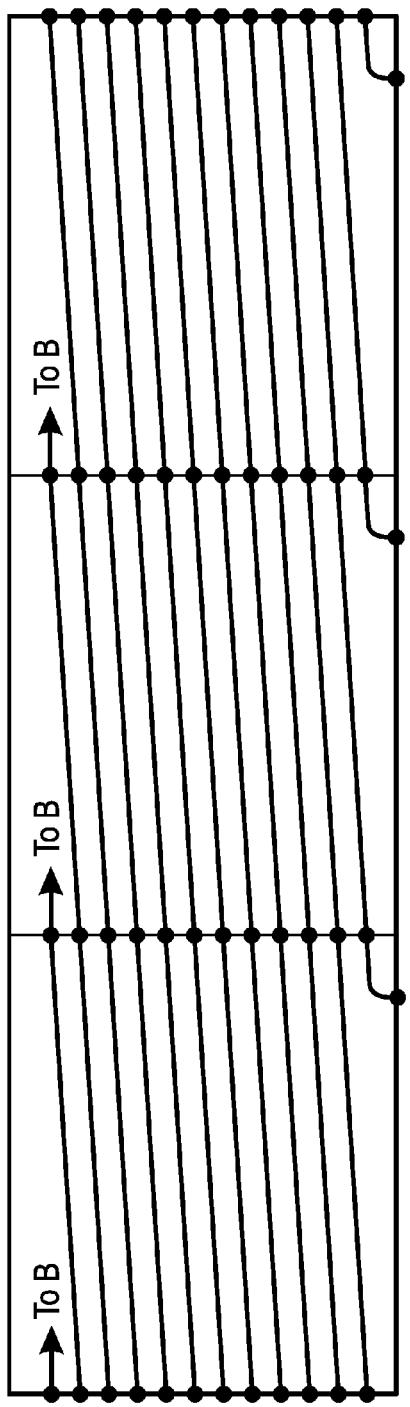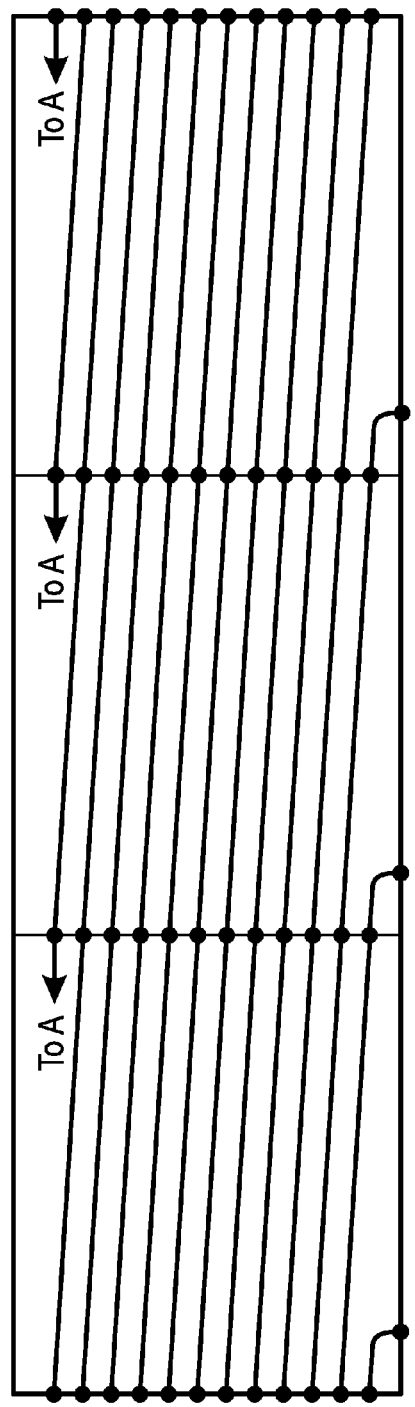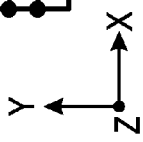
FIG. 11A
FIG. 11B

DEVICE AND SYSTEM FOR THE DISTRIBUTION OF CABLING IN DATA CENTER ENVIRONMENTS

CROSS-REFERENCE TO RELATED APPLICATIONS

This application claims priority to U.S. Provisional Patent App. No. 62/165,605, filed on May 22, 2015, and titled "Device and System for the Distribution of Cabling in IT Data Center Environments," and further claims priority to U.S. Provisional Patent App. No. 62/296,517, filed on Feb. 17, 2016, and titled "Device and System for the Distribution of Cabling in IT Data Center Environments," the entireties of both of which are hereby incorporated herein by reference.

BACKGROUND

Field of the Invention

The embodiments described herein are generally directed to the distribution of network, power, and other cabling in information technology (IT) environments, and, more particularly, to IT technology and telecom data centers where network, power, and other cabling are distributed to high-availability IT and communication systems.

Description of the Related Art

Generally, IT data centers are provisioned with open or locking server racks or cabinets (hereinafter, "cabinet" or "cabinets"). Network and electrical cabling is run from a central point to each individual cabinet according to the specific requirements of each cabinet. Network cabling is typically provisioned to the cabinets overhead through the use of cable trays and/or ladder racks. Power cabling is provisioned in a similar manner and many times through the bottom of the cabinet within pre-constructed conduits or raised flooring.

Limitations of current technology and practices include:
(1) Physical exposure of cabling to the open environment resulting in an unsecure state, especially in public data center settings;
(2) Once deployed, changes to network or power cabling can be difficult due to the bundling of multiple cabinet cable runs in the tray or ladder rack; and/or
(3) Cable traceability from the central point to the cabinet can be complex since many cabinet cable runs are grouped together, thereby complicating changes to cable configurations.

SUMMARY

Accordingly, devices and systems are disclosed for distributing cabling in a data center environment. In an embodiment, an apparatus is disclosed. The apparatus comprises: a conduit unit comprising a first level, a second level, and an articulated conduit; wherein each of the first level and the second level comprises a plurality of openings on a first surface of the conduit unit and a plurality of openings on a second surface of the conduit unit that is opposite the first surface, wherein the plurality of openings on each of the first surface and the second surface are arranged in a row parallel to a first axis, and wherein each of the plurality of openings on the first surface is opposite to exactly one of the plurality of openings on the second surface, a plurality of main conduits between the first surface and the second surface, wherein each of the plurality of main conduits comprises a through passage for one or more cables, wherein each of the plurality of main conduits is parallel to each of the other plurality of main conduits, and wherein each of the plurality of main conduits is angled with respect to a second axis that intersects both the first surface and the second surface and that is orthogonal to the first axis, such that each of the plurality of main conduits connects one of the plurality of openings on the first surface to one of the plurality of openings on the second surface that is adjacent within its row to the one opening on the second surface that is opposite to that one opening on the first surface, and a divergent conduit that connects one of the plurality of openings on one of the first surface or the second surface to an opening on a third surface of the conduit unit; and wherein the articulated conduit connects one of the plurality of openings on one of the first surface or the second surface to an opening on the other one of the first surface or the second surface of the other level of the conduit unit, wherein the articulated conduit is angled with respect to a third axis that is orthogonal to the first axis and the second axis.

BRIEF DESCRIPTION OF THE DRAWINGS

The details of the present invention, both as to its structure and operation, may be gleaned in part by study of the accompanying drawings, in which like reference numerals refer to like parts, and in which:

FIGS. 11A and 11B illustrate an arrangement of a plurality of adjacent conduit units from FIGS. 10A and 10B, according to an embodiment;

DETAILED DESCRIPTION

Figure 1:
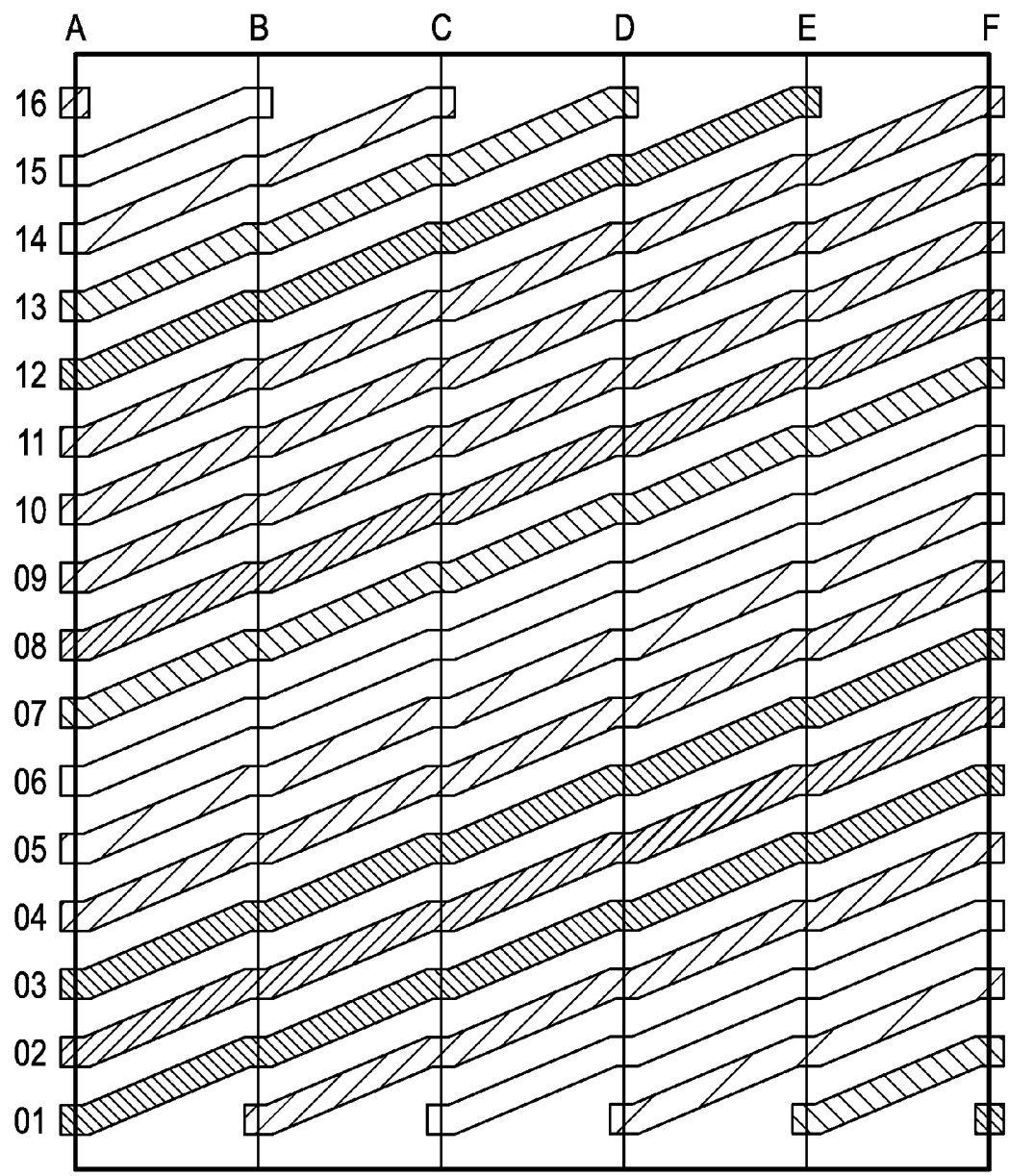
FIG. 1 illustrates a simplified representation of the pathways formed by combinations of modules and conduits, with two distinct pathways to each cabinet, according to an embodiment.

In embodiments, devices and systems for distributing cabling in a data center environment are disclosed. Embodiments of the disclosed system may provide one or more of the following benefits over current solutions: ease of cabinet cabling configuration and deployment; secure, divergent pathways from a central point to each individual cabinet; reduced "headroom" requirements for the provisioning of cabling; simplified cable management due to each pathway being isolated and easily traceable from the central point to each cabinet; security compliance through cable segregation and enclosed design; and/or elegant visual within the data center, eliminating "rat's nests" that can evolve over time.

After reading this description, it will become apparent to one skilled in the art how to implement the invention in various alternative embodiments and alternative applications. However, although various embodiments of the present invention will be described herein, it is understood that these embodiments are presented by way of example and illustration only, and not limitation. As such, this detailed description of various embodiments should not be construed to limit the scope or breadth of the present invention as set forth in the appended claims.

1. First Embodiment

In a first embodiment, the disclosed system comprises two types of components: (1) a module with a number of holes formed through the module and arranged in a row; and (2) a conduit for guiding cabling and configured to be inserted into or otherwise be connected to one or more holes in a module. The module may be a rectangular structure made of conventional materials, such as, acrylonitrile-butadiene-styrene (ABS), polyvinyl chloride (PVC), high-density polyethylene, polypropylene, polycarbonate, etc. The module may be sized to fit a standard cabinet (e.g., the width of a module may be identical to or smaller than a width of a standard cabinet). The hole(s) in each module may be sized to accommodate the diameter of each conduit, such that each conduit can be inserted into each module and held securely by the module (e.g., via friction, and/or any known fixing mechanism, including screws, adhesive, etc.). Thus, two modules may be joined by a set of one or more conduits running from the holes of one module to holes of the other module.

A module may be mounted on or under each cabinet, connecting to the top or bottom of each cabinet at a side at which the cabinet meets an adjacent cabinet. Each module may be linked to an adjacent module (e.g., that is connected to an adjacent side of an adjacent cabinet) with an offset of one conduit. Each pair of adjacent modules may be fitted with a number of discrete conduits that serve as the pathways for the cabling between the adjacent modules and provides for two paths into each cabinet (e.g., via one conduit in each module in the adjacent pair of modules).

In an embodiment, the system provides for two separate, non-adjacent pathways into each cabinet. Each conduit path into the cabinet, which may be referred to herein as a "divergent path" and may be implemented by a "divergent conduit," may be at a different orientation (e.g., substantially orthogonal) than the conduit path between adjacent modules. For example, the conduit paths between adjacent modules may be horizontal with respect to the cabinet, whereas the divergent conduit paths into the cabinet may be vertical with respect to the cabinet. The conduits can be of any diameter to accommodate the type of cable required.

Between the module and an entry point of a divergent conduit into its respective cabinet, an elbowed conduit may be provided to effect the change in direction of the divergent conduit with respect to a non-divergent conduit path between adjacent modules. For example, the elbowed conduit may change the conduit path from a horizontal path out of the module to a substantially orthogonal vertical path into the cabinet.

The number of cabinets in a row that can be provisioned may be increased by stacking any number of modules on top of each other. An articulated conduit (e.g., flexible conduit, or non-flexible, vertically angled conduit) may connect adjacent levels of the stacked modules.

In an embodiment, each module and/or conduit is constructed such that, when the conduits are inserted into the holes of a module, the conduits are angled with respect to the module. For example, each conduit may exit each module at an angle, such that the conduit extending from a first module to a second module connects to the second module at a hole that is offset by one hole from the corresponding hole at which the conduit is connected to the first module. Thus, even though the conduits are angled, the system of modules remains parallel with the edges of the cabinet, eliminating "drift" in configurations with a high number of cabinets in a row.

FIG. 1 illustrates a simplified representation of a number of adjacent modules connected by conduits, with each patterned line representing a unique, secure main conduit path, according to an embodiment. Each module A-F is parallel with an edge of a cabinet (represented by the vertical axis in FIG. 1) that is orthogonal to the longitudinal direction of the row of cabinets (represented by the horizontal axis in FIG. 1). Each module in the illustrated example comprises sixteen holes 01-16. Each main conduit (i.e., each angled patterned line in FIG. 1), runs between a pair of modules such that it connects to a hole in one module that is offset by one from the hole in the other module. For example, the bottom-most conduit between modules A and B connects to hole 01 of module A and hole 02 of module B.

It should be understood that any of the conduits and/or their corresponding holes, described herein, may be shaped in any manner suitable for providing the passage of cables. For example, while the conduits and holes will primarily be illustrated with a circular cross-section, the conduits and/or holes may have a cross-section in other shapes, including ovals, squares, rectangles, triangles, pentagons, hexagons, octagons, stars, etc. Furthermore, different conduits discussed herein may have different shapes and/or sizes or the same shape and/or size.

In an embodiment, one of the two holes at the end of one or more of the modules (e.g., either hole 01 or hole 16 of each module shown in FIG. 1) may connect to an elbowed divergent conduit with a divergent path into the cabinet to which the module is attached. In addition, the other one of the two end holes of one or more of the modules may connect to another module on a level that is stacked above or below that module's level via an articulated conduit.

For example, a second set of modules A-F may be stacked on top of the set of modules A-F shown in FIG. 1. The main conduits connecting this second set of modules may be angled in the opposite direction as shown in FIG. 1 (i.e., from top to bottom in the left-to-right direction, as opposed to bottom to top). In this case, an articulated conduit can be provided between hole 01 of a module in one level of the stack and hole 01 of an adjacent module in an adjacent level of the stack. For instance, an articulated conduit may be provided between hole 01 of module A in a first level of the stack and hole 01 of module B in a second level of the stack. Thus, whereas the main conduits between modules in the same stack level may be angled in the horizontal direction (e.g., offset between modules by one hole) but not in the vertical direction, the articulated conduits between modules in different stack levels may be angled in the vertical direction but not in the horizontal direction. More generally, the main conduits between modules in the same stack level may be angled relative to a first axis, whereas the articulated conduits between modules in different stack levels may be angled relative to a second axis that is orthogonal to the first axis.

Figure 2:
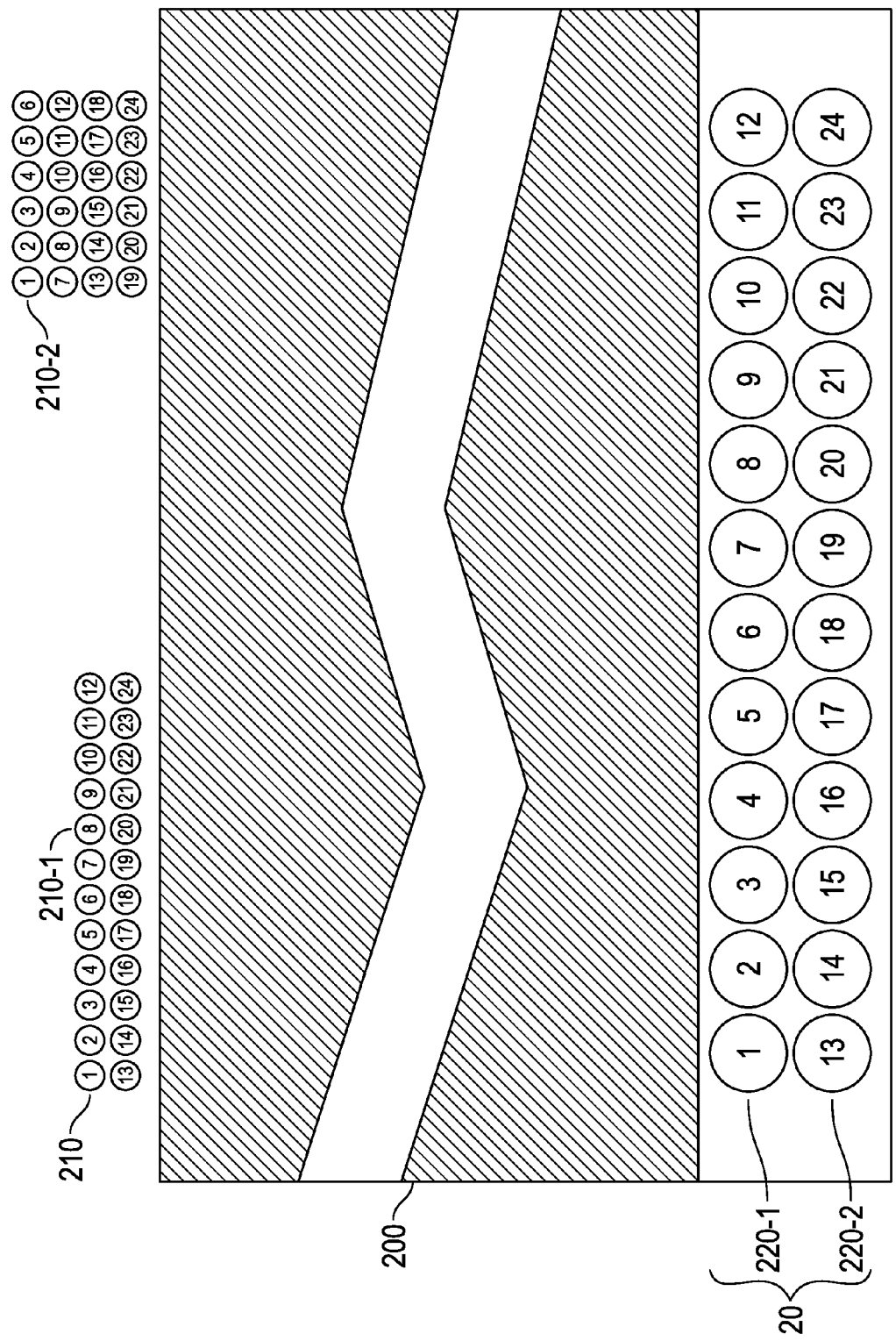
FIG. 2 illustrates a side-view cross-section with representative, individual, differently-sized conduit pathways above and below a cabinet, according to an embodiment.

FIG. 2 is a cross-sectional view of a cabinet 200 with an installation of both upper modules 210 above cabinet 200 and lower modules 220 below cabinet 200, according to an embodiment. The upper installation of modules 210 may be similar in configuration to the set of modules and conduits illustrated in FIG. 1. The upper installation of modules 210-1 comprises only two levels of stacked modules, and the upper installation of modules 210-2 comprises four levels of stacked modules. The lower installation of modules 220 comprises a stack of modules including a first level 220-1 and a second level 220-2.

Figure 3:
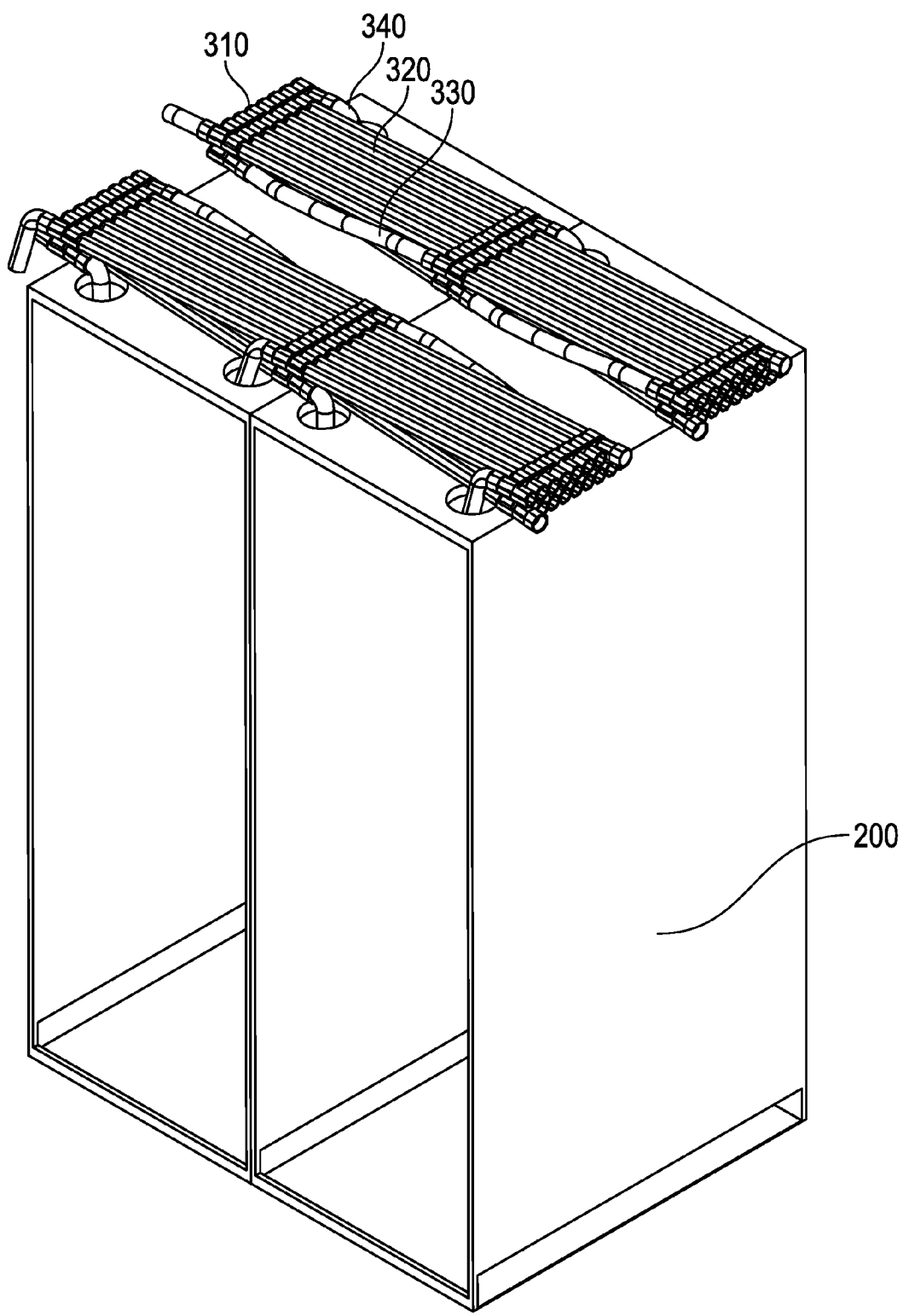
FIG. 3 illustrates a system of modules and conduits placed in a row of server cabinets, according to an embodiment.

FIGS. 3A and 3B illustrate an installation of modules and conduits on the top front and top rear of each cabinet, according to an embodiment. In this example, connecting modules 310 are created with seven holes in which to insert seven main conduits 320. Each connecting module 310 has a set of angled holes at each edge, such that as modules 310 are connected together, modules 310 remain parallel with the edge of the cabinet 200 while main conduits 320 connect between pairs of modules 310 at an angle (e.g., one-hole offset). Alternatively, instead of angled holes, modules 310 may comprise straight holes, and main conduits 320 may comprise angled ends which fit into the straight holes of modules 310 and then bend to an angle outside of those holes.

Connecting modules 310 may be manufactured as an integrated component of the cabinet or manufactured separately and affixed to the top and/or bottom of each cabinet as the cabinet is installed in its desired location. A single pair of modules 310 with connecting main conduit(s) 320 can be placed in the front of the cabinet, resulting in two divergent paths into each cabinet via the two divergent conduits 340 for the pair of modules 310. An additional pair of modules 310 and conduit(s) 320 can be placed in the rear of the cabinet, providing at least four divergent paths into the cabinet via the divergent conduit 340 for each of the four modules 310 in the front and rear pairs of modules 310. Stacking of additional modules 310 and conduit(s) 320 or placing the modules 310 and conduit(s) 320 side-by-side, provide for the addition of more cabinets 200 in the row. Connecting pathways between levels may be accomplished through articulated conduit 330 between a level of modules 310 and main conduit(s) 320.

In an embodiment, modules 310 and conduit(s) 320, 330, and 340 are manufactured as separate components, which are assembled as part of the manufacturing process or after the manufacturing process (e.g., after purchase). When assembled, modules 310 and conduit(s) 320, 330, and/or 340 may remain capable of disassembly, such that each component may be reused for different assemblies and configurations. Alternatively, a set of two or more modules 310 and conduit(s) 320, 330, and/or 340 may be manufactured or sold as a single integrated apparatus. For example, one integrated or assembled unit may comprise a pair of modules 310 and main conduit(s) 320 running from each hole in one of the pair of modules 310 to an offset hole in the other one of the pair of modules 310, except for one corresponding pair of holes which may remain open for connection with an articulated conduit 330 and/or divergent conduit 340. Alternatively, a stack of such units may be manufactured or sold as one integrated or assembled apparatus, including articulated conduit 330 between level(s), and, optionally, divergent conduit 340 for at least the first level.

Figure 5:
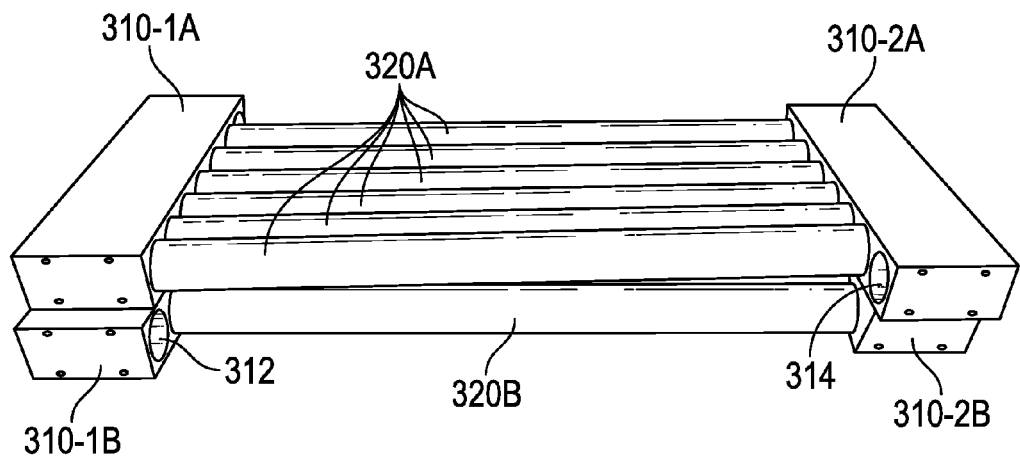
FIG. 5 illustrates a side view of two levels of modules and conduits in which the connection points of a conduit to a pair of modules are offset from each other by one hole.
Figure 6:
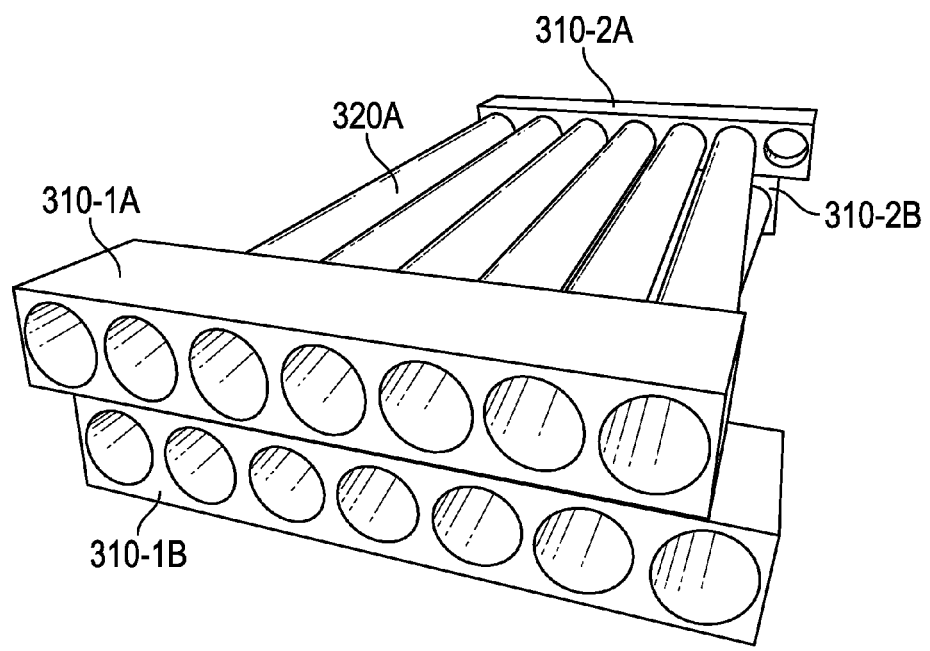
FIG. 6 illustrates a front view of the two levels of modules and conduits in FIG. 5, according to an embodiment.

FIGS. 5 and 6 illustrate two levels of modules 310 and main conduits 320, according to an embodiment. Specifically, two adjacent modules 310-1A and 310-2A are joined by six main conduits 320A. As used herein, this configuration of two adjacent modules joined by a set of main conduits can be considered one "module-and-conduit unit." The lower, obscured level comprises an identical pair of modules 310-1B and 310-2B and conduits 320B, but reversed in terms of the angles of the conduits, such that an empty hole 312 in module 310-1B of the lower level faces an empty hole 314 in module 310-2A of the upper level. As discussed above, an articulated conduit 330 can be connected between these two facing holes 312 and 314 to provide a connecting pathway between the upper and lower levels.

As illustrated in FIG. 6, the modules 310-1A and 310-1B in the upper and lower levels, respectively, may be positioned with an offset between the two, such that module 310-1A in the upper level is shifted with respect to module 310-1B in the lower level in a longitudinal direction of the modules. In addition, module 310-2A in the upper level is shifted with respect to module 310-2B in the lower level in the opposite longitudinal direction as modules 310-1A and 310-1B. In this manner, modules 310 are arranged such that an empty hole at an end of the lower level faces an empty hole at the same end of the upper level, providing a path for an articulated conduit 330 between adjacent modules in adjacent levels of a stack (e.g., a path between hole 312 in 310-1B and hole 314 in 310-2A).

Figure 7A:
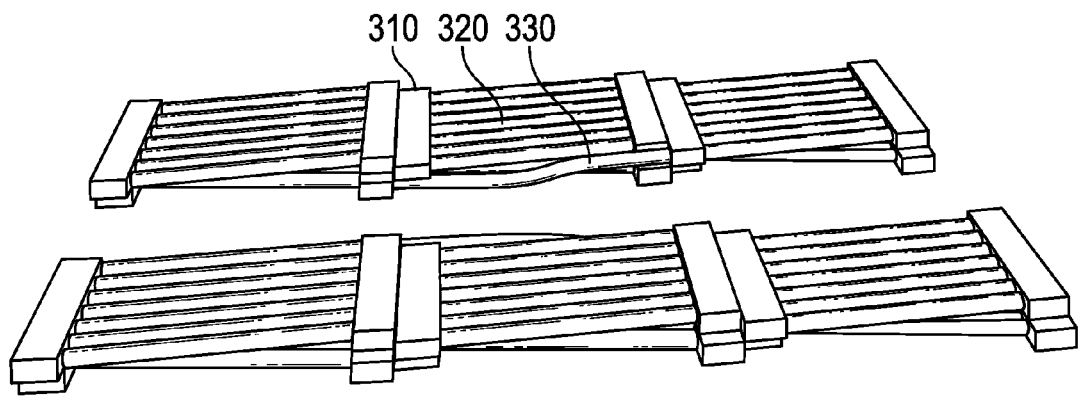
FIGS. 7A and 7B illustrate two sets of modules and conduits, each stacked in two levels, with the levels of each set connected via an articulated conduit, according to an embodiment.
Figure 7B:
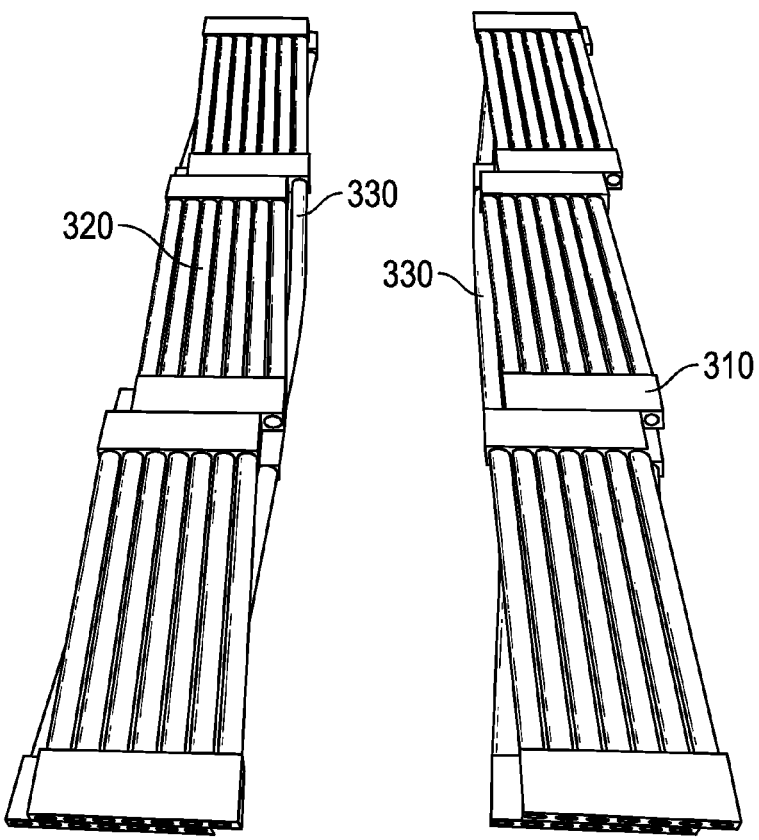

FIGS. 7A and 7B illustrate a configuration of modules 310 and main conduits 320 with two parallel, spaced sets of units, both of which are three units long and stacked two units high. As illustrated, articulated conduits 330 join holes in modules of the upper and lower levels of the stacks.

Figure 8A:
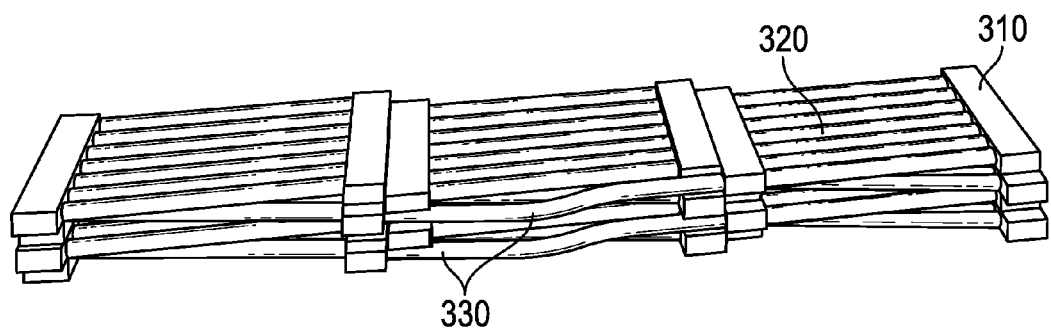
FIGS. 8A and 8B illustrate a set of modules and conduits stacked in four levels, with levels in each of the top two levels and bottom two levels connected via an articulated conduit, according to an embodiment.
Figure 8B:
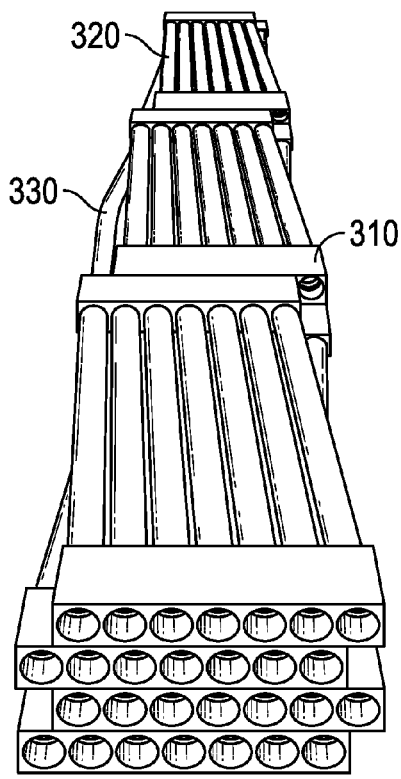

FIGS. 8A and 8B illustrate a configuration of modules 310 and main conduits 320 with one set of units which is three units long and stacked four units high. Again, articulated conduits 330 join holes in modules of adjacent levels of the stack.

Figure 9A:
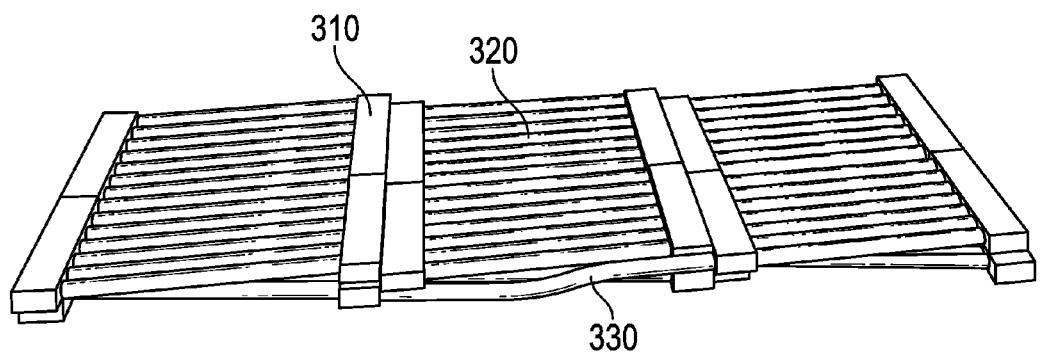
FIGS. 9A and 9B illustrate two sets of modules and conduits, each stacked in two levels side-by-side, with the levels connected via an articulated conduit, according to an embodiment.
Figure 9B:
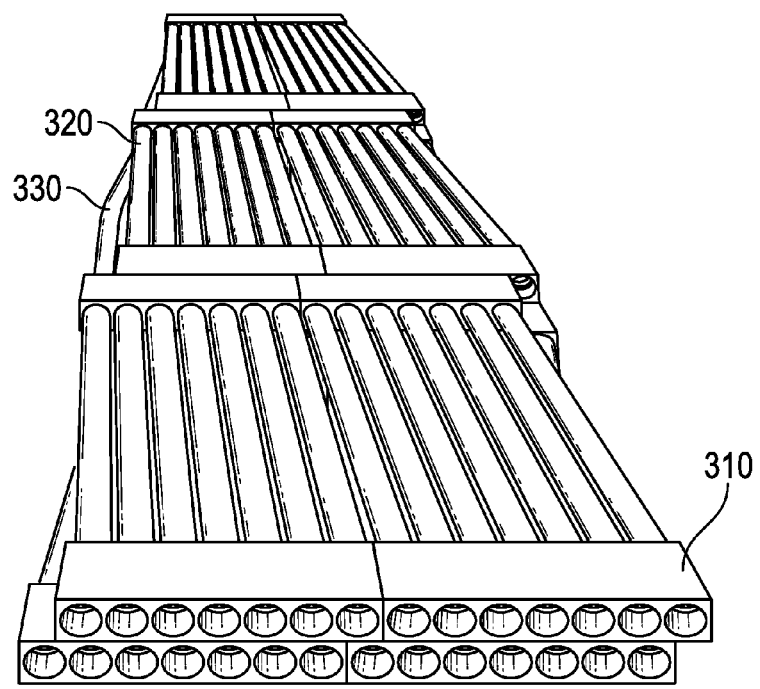

FIGS. 9A and 9B illustrate a configuration of modules 310 and main conduits 320 with two parallel, un-spaced sets of units, both of which are three units long and stacked two units high. Articulated conduit 330 joins holes in modules of the upper and lower levels of the stack. It should be understood that this configuration could also be achieved with one set of units that is three units long and stacked two units high, but which have twice the number of holes as depicted modules 310.

Figure 4:
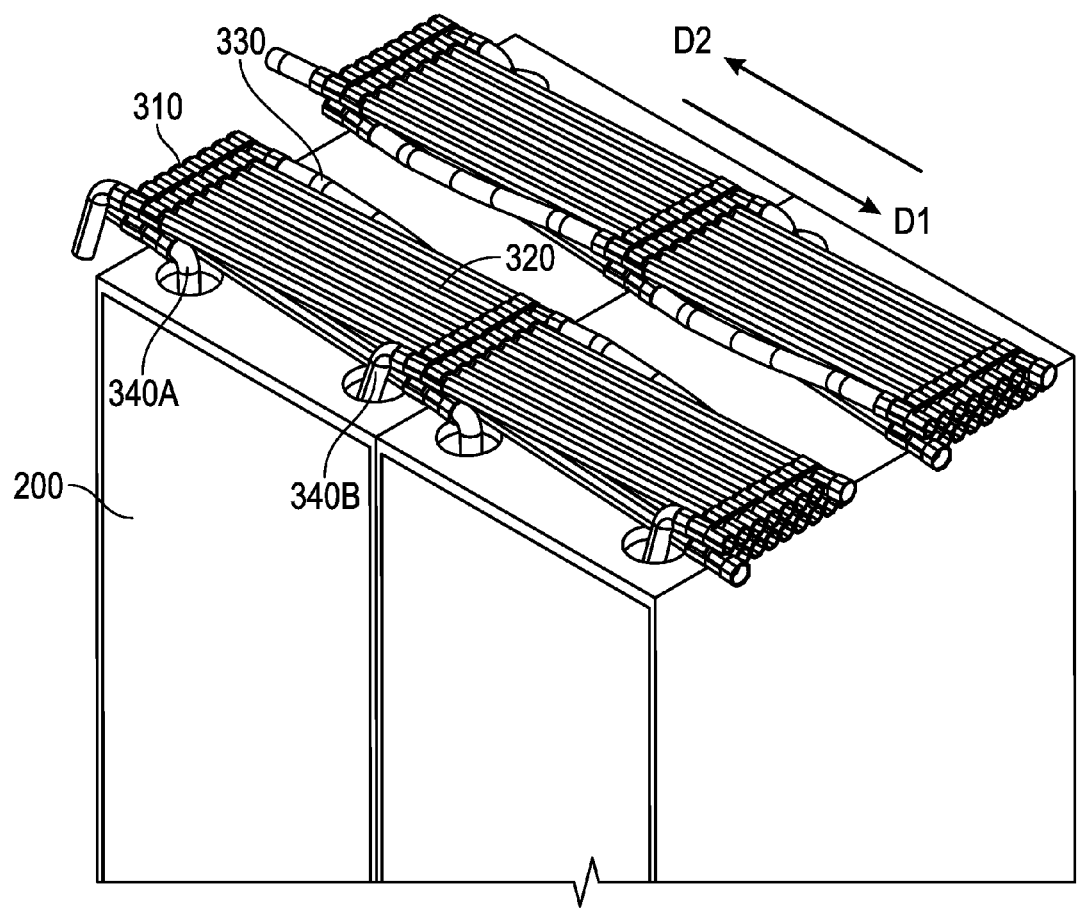
FIG. 4 illustrates the stacking of modules and conduits utilizing an articulated conduit between stack levels, according to an embodiment.

As illustrated in FIG. 4 and the configurations in FIGS. 7-9B, in embodiments, an even number of levels may be provided (e.g., two, four, six, etc.). In such, embodiments, adjacent stack levels (e.g., the first level and the second level of a stack) can provide pathways (e.g., for cables, wires, etc.) in opposite directions. For example, using FIG. 4 as a reference, cables or wires in the first stack level (e.g., bottom level) may all run in a first direction D1 (e.g., left to right), whereas cables or wires in the second stack level (e.g., top level) may all run in a second direction D2 (e.g., right to left) that is opposite to the first direction. Notably, in such a configuration, each cabinet 200 can be provided with a pathway from opposite directions (i.e., from each of directions D1 and D2).

For example, using the example above, divergent conduit 340A (e.g., illustrated as an elbowed conduit) provides a pathway for cables or wires in the first direction D1 (i.e., in the first stack level) into cabinet 200, and divergent conduit 340B provides a pathway for cables or wires in the second direction D2 (i.e., in the second stack level) into cabinet 200. In this manner, a loop can be established using a pair of levels. Each pair of levels can provide a separate loop. For example, in the four-level configuration illustrated in FIGS. 8A and 8B, two separate loops can be provided.

Advantageously, loops (i.e., pathways provided in both directions) can provide improved reliability over systems in which pathways are provided in only one direction. For instance, if a failure occurs in the data pathway in one direction, a data pathway in the other direction remains. Thus, if some failure or other event occurred in the pathway in direction D1 in the first stack level, the second stack level provides a redundant pathway into each cabinet 200 in the opposite direction D2.

To summarize, in a first embodiment, an apparatus may comprise: a first module comprising a structure with a plurality of holes extending through the structure and arranged in a row along a first axis; and a plurality of first conduits, wherein each of the plurality of first conduits is configured to fit into at least one of the plurality of holes, and wherein each of the plurality of first conduits comprises a through passage for one or more cables; wherein, when each of the plurality of first conduits is fit into one of the plurality of holes, each first conduit is parallel with each of the other ones of the plurality of first conduits and is at an angle with respect to a second axis that is orthogonal to the first axis. Each of the plurality of holes may be formed at the angle with respect to the second axis. Alternatively, each of the plurality of holes may be parallel with the second axis, and each of the plurality of first conduits may comprise a central portion and two ends that are angled with respect to the central portion.

The apparatus may further comprise at least one second conduit configured to fit into at least one of the plurality of holes, wherein the second conduit comprises a through passage for one or more cables, and wherein the second conduit bends such that, when a first end of the second conduit is fit into one of the plurality of holes, a second end of the second conduit that is opposite the first end is parallel to a third axis which is substantially orthogonal to both the first axis and the second axis. The first module may be fixed to an outside surface of a cabinet, and the second conduit may pass into an interior of the cabinet such that the second end of the second conduit is inside the cabinet.

The apparatus may further comprise at least one third conduit configured to fit into at least one of the plurality of holes, wherein the third conduit comprises a through passage for one or more cables, and wherein, when the third conduit is fit into one of the plurality of holes, the third conduit is at an angle with respect to the second axis in a plane which is orthogonal to a plane that includes both the first axis and the second axis.

The first module may be configured to be fixed to a cabinet. Each of the plurality of holes may pass through the first module such that it is open to an exterior of the module at both ends. Each of the conduits may be removeably coupleable to at least one of the plurality of holes in the first module.

The apparatus may further comprise a second module comprising a plurality of holes arranged in a row. The first module and the second module may comprise the same number of holes. Additionally, the first module and the second module may be identical to each other. The second module may be arranged with respect to the first module such that each of the plurality of holes in the second module faces one of the plurality of holes in the first module. In addition, for each of the plurality of first conduits, a first end of the first conduit may be fit into one of the plurality of holes in the first module and a second end of the first conduit may be fit into one of the plurality of holes in the second module that is offset by one hole from the hole in the second module that faces the one hole in the first module into which the first end of the first conduit is fit.

A first one of the plurality of holes in each of the first module and the second module may not have any of the plurality of first conduits fit into it. The first hole in the first module and the first hole in the second module may be at opposite ends of their respective rows. The apparatus may further comprise, for one or both of the first module and the second module, at least one second conduit comprising a first end that is fit into the first hole, wherein the second conduit comprises a through passage for one or more cables, and wherein the second conduit bends such that a second end of the second conduit that is opposite the first end is parallel to a third axis which is substantially orthogonal to both the first axis and the second axis. The apparatus may also comprise, for one or both of the first module and the second module, at least one third conduit that is fit into the first hole, wherein the third conduit comprises a through passage for one or more cables, and wherein the third conduit is at an angle with respect to the second axis in a plane which is orthogonal to a plane that includes both the first axis and the second axis.

The first module, the second module, and the plurality of first conduits between the first module and the second module form a first unit in a first level. The apparatus may further comprise a first plurality of units, including the first unit, wherein the first plurality of units are arranged in the first level in a row parallel to the second axis, such that each of the plurality of holes in one of the first and second modules in each of the first plurality of units faces one of the plurality of holes in one of the first and second modules in an adjacent one of the first plurality of units, so that one or more cables may pass between each pair of facing holes. Each of the first plurality of units may be fixed to a cabinet.

The apparatus may further comprise a second plurality of units, wherein the second plurality of units are arranged in a second level in a row parallel to the second axis, such that each of the plurality of holes in one of the first and second modules in each of the second plurality of units faces one of the plurality of holes in one of the first and second modules in an adjacent one of the second plurality of units, so that one or more cables may pass between each pair of facing holes, and wherein the second level is offset from the first level along a third axis that is orthogonal to both the first axis and the second axis. The second level may be offset from the first level along the first axis. The apparatus may further comprise at least one third conduit comprising a first end that is fit into a hole in the first module of the first unit in the first level and a second end that is fit into a hole in the second module of a second unit in the second level. The hole into which the first end of the third conduit is fit may be at a same end of the row in the first module of the first unit as the hole in the second module in the second unit into which the second end of the third conduit is fit. Each of the first plurality of units may be fixed to a cabinet, and each of the second plurality of units may be fixed to either a cabinet or one of the first plurality of units on a side of one of the first plurality of units that is opposite a cabinet.

Within each of the first plurality of units and each of the second plurality of units: a first one of the plurality of holes in either the first module or the second module of the unit may be fitted with a second conduit, wherein the second conduit bends to a third axis which is substantially orthogonal to both the first axis and the second axis and provides a passageway into a cabinet; and a second one of the plurality of holes in either the first module and the second module of the unit may be fitted with a third conduit, wherein the third conduit bends towards the third axis and provides a passageway between the first level and the second level. In addition, within each of the first plurality of units and the second plurality of units, the first hole and the second hole may be in different ones of the first module and the second module, and may be at opposite ends of their respective rows in their respective modules. Each unit in the first plurality of units may be adjacent along the third axis to a unit in the second plurality of units, thereby forming a pair of stacked units comprising a lower unit and an upper unit, and, for each pair of stacked units, a lower second conduit may be fitted within a hole in the lower unit that is on an opposite side of the pair of stacked units than a hole in the upper unit into which an upper second conduit is fitted. Each pair of stacked units may be configured to be fixed to a cabinet, such that the lower second conduit and the upper second conduit each provide a separate pathway into the cabinet.

The apparatus may further comprise a first set of cables or wires provided through the first plurality of units in a first direction; and a second set of cables or wires provided through the second plurality of units in a second direction that is substantially opposite the first direction; such that, for each pair of stacked units, when fixed to a cabinet, the lower second conduit provides a first pathway for the first set of cables or wires in the first direction into the cabinet, and the upper second conduit provides a second pathway for the second set of cables or wires in the second direction into the cabinet.

2. Second Embodiment

In a second embodiment, the disclosed system comprises one or more conduit blocks with one or more conduit units formed therein. The second embodiment may differ from the first embodiment only in that, in the second embodiment, conduits are integrated into a single component (e.g., unit and/or block), whereas, in the first embodiment, conduits are described as separate, individual components that are joined together into a unit via connection with a pair of modules. The arrangements of the conduits may be the same between embodiments. Thus, the arrangements of conduits discussed above with respect to the first embodiment may be used for the arrangement of conduits in the second embodiment, and the arrangement of conduits discussed below with respect to the second embodiment may be used for the arrangement of conduits in the first embodiment.

In the second embodiment, one or more conduit blocks may be mounted on or under each cabinet, connecting to the top, bottom, or side of each cabinet, in a similar or identical manner as the first embodiment. Each conduit block may be linked to an adjacent conduit block (e.g., that is connected to an adjacent side of an adjacent cabinet or the same cabinet), such that the conduits within each conduit unit in each conduit block form a continuous path with an adjacent conduit in the adjacent conduit unit in the adjacent conduit block. Thus, each conduit in each conduit unit may serve as a pathway for the cabling between adjacent conduit blocks.

In addition, each conduit unit may provide one or more, including a plurality of, paths into each cabinet. Each conduit path into the cabinet, which may be referred to herein as a "divergent path" and implemented by a "divergent conduit," may be at a different orientation than the conduit paths providing paths between adjacent conduit units. In addition, it should be understood that each divergent conduit may, but need not, provide a direct path into a cabinet. For example, a divergent conduit may provide an opening in its corresponding conduit unit, which directly or indirectly (e.g., via an external conduit) provides a path into a cabinet.

In an embodiment, a conduit unit may comprise at least two levels of conduits, and an articulated (e.g., vertically angled) conduit may traverse the two levels. One of the two levels of conduits provides a path to each cabinet in a first direction, and the other of the two levels of conduits provides a path to each cabinet in a second direction that is opposite the first direction.

In an embodiment, the number of cabinets in a row that can be provisioned is increased by combining any number of conduit units into a single conduit block. The conduit units may be vertically and/or horizontally aligned with each other within the conduit block, and a single conduit block may comprise a plurality of conduit units of different sizes. In addition, the conduit blocks may themselves be vertically and/or horizontally aligned in a similar manner.

The conduits, divergent, articulated, or otherwise, can be of any diameter to accommodate the type of cabling required.

In an embodiment, each conduit unit is constructed such that conduits are formed at an angle with respect to an edge of the conduit block running between the two surfaces of the conduit block having the openings to the ends of the conduit units. For example, conduits may be formed in the conduit block at an angle, such that the hole forming an end of the conduit on one surface of the conduit unit in the conduit block is offset by one hole from the hole forming the opposite end of the conduit on the opposing surface of the conduit unit in the conduit block. Thus, even though the conduits are angled, the system, regardless of how many conduit blocks it includes, remains parallel with the edge of the cabinet, eliminating "drift" in high-number cabinet row configurations.

Figure 10A:
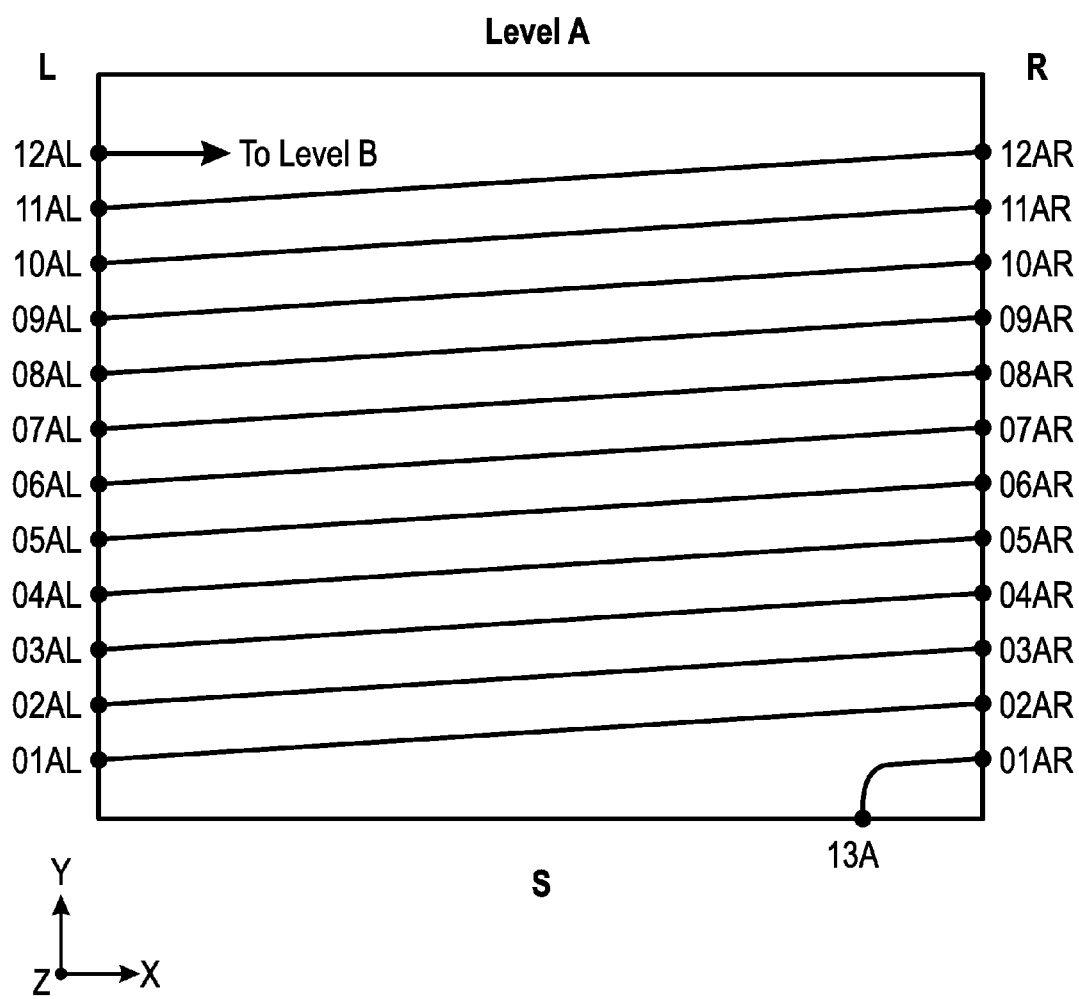
FIGS. 10A and 10B illustrate an arrangement of conduits within a two-level conduit unit, according to an embodiment.
Figure 10B:
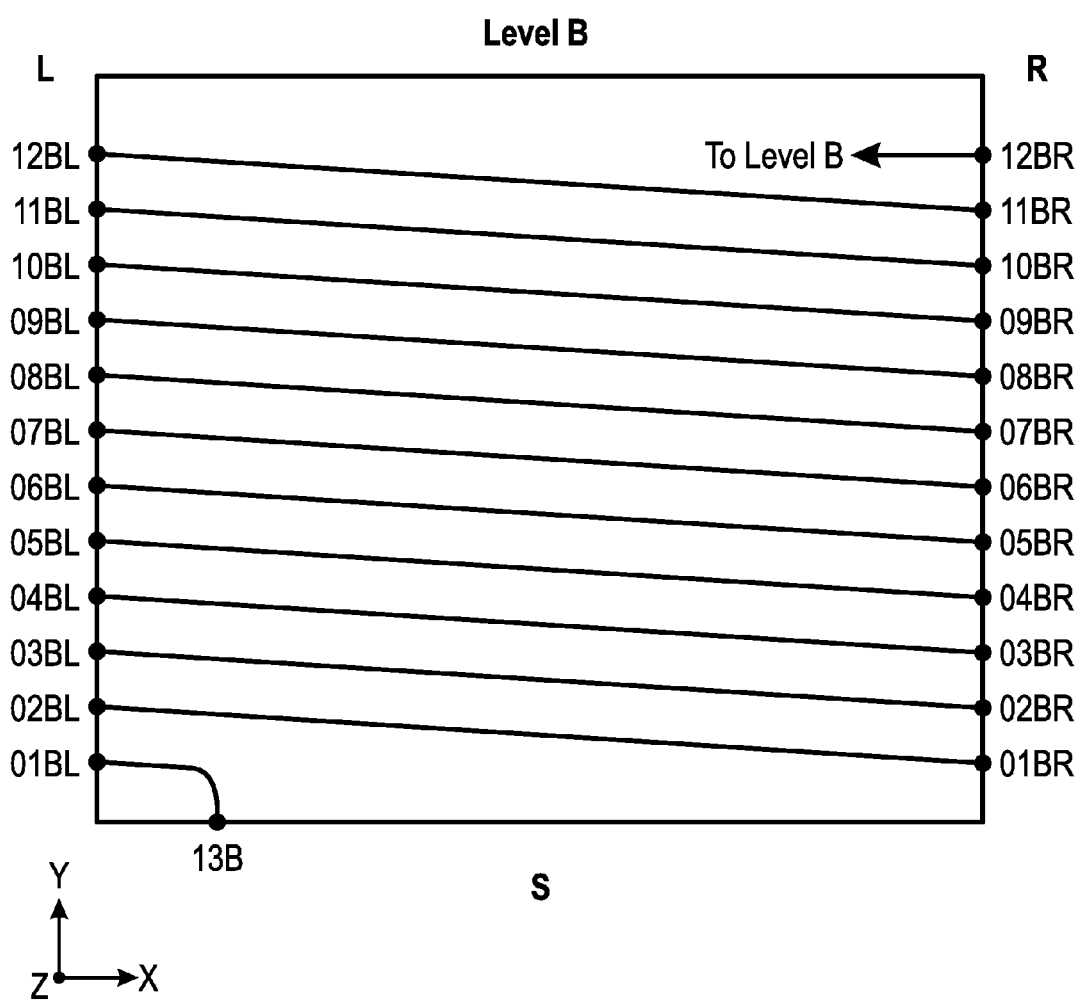

FIGS. 10A and 10B illustrate two levels of a single conduit unit, according to an embodiment. FIGS. 10A and 10B illustrate twelve openings in two opposite surfaces L and R (which are planes along the Y and Z axes, with the Z axis being orthogonal to the plane of the figures) of a conduit unit, and two openings in a third surface S (which is a plane along the X and Z axes) of the conduit unit. However, it should be understand that surfaces L and R may have any number of openings, including fewer or more than the number illustrated. As used herein, the "first surface" may refer to either surfaces L or R, the "second surface" may refer to the other one of surfaces L or R, the "third surface" may refer to surface S, the "first axis" may refer to axis Y, the "second axis" may refer to axis X, and the "third axis" may refer to axis Z.

As illustrated, each of the conduits 01AL-02AR through 11AL-12AR in Level A and conduits 02BL-01BR through 12BL-11BR in Level B are angled with respect to an edge S of the conduit unit, i.e., with respect to the X axis in FIGS.

10A and 10B. For ease of description, each of these conduits, which run from surface L to surface R at an angle to the X axis, will be referred to herein as a main conduit. While each conduit unit herein is illustrated with eleven main conduits, a conduit unit may comprise any number of main conduits, including fewer (e.g., one, two, six, ten, etc.) or more main conduits (e.g., sixteen, twenty-four, one hundred, etc.). In addition, while the numbers of conduits on each of Levels A and B are illustrated as being the same number, it should be understood that this is not a necessity.

For each main conduit, the opening on one side of the conduit unit is offset from the opening on the other side of the conduit block by one opening. For example, the opening 01AL is connected to opening 02AR to form one main conduit, the opening 02AL is connected by a conduit to opening 03AR to form another main conduit, and so on. It should be understood that if surface S of a conduit unit is parallel with a side surface of a cabinet, the main conduits in the conduit unit will be identically angled with respect to the side surface of the cabinet as well.

In an embodiment, one of the two end conduits in each level of each conduit unit (e.g., conduit 13A-01AR and conduit 01BL-13B) may diverge with respect to the angle of the other conduits, such that it has an opening through a different surface (e.g., surface S) of the conduit unit than the other conduits (e.g., which open through surfaces L and R). Such a conduit will be referred to herein as a "divergent conduit." In the embodiment illustrated in FIGS. 1A-1B, each divergent conduit 13A-01AR and 01BL-13B is substantially parallel with the X axis and then curves to become substantially parallel with the Y axis. However, the divergent conduits do not necessarily need to possess such an outline, and may take other outlines, including a right angle, a single straight line (e.g., from 13A to 01AR), two or more straight lines that are each angled with respect to the X and/or Y axes and join at one or more points, etc.

In an embodiment, the other one of the two end conduits in each level of each conduit unit (e.g., conduit 12AL-12BR) may traverse two levels (e.g., Levels A and B) in the conduit unit. Such a conduit will be referred to herein as "articulated conduit." As illustrated in FIGS. 10A-10B, the divergent conduit 12AL-12BR is parallel to the X axis, but angled with respect to the Z axis.

It should be understood that the conduits, whether a main conduit, divergent conduit, or articulated conduit, and/or their corresponding openings may be shaped and/or sized in any manner suitable for providing the passage of cables. For example, while these conduits and openings will primarily be illustrated with a circular cross-section, these conduits and/or openings may have a cross-section in other shapes, including ovals, squares, rectangles, triangles, pentagons, hexagons, octagons, stars, etc. Furthermore, different conduits, within the same conduit unit, may have the same shape and/or size or different shapes and/or sizes.

FIGS. 11A-12B illustrate Levels A and B, respectively of three adjacent conduit units. It should be understood that any number of conduit units may be joined along the X axis, in this manner, to create a system of virtually any length. Notably, each conduit on each level of each conduit unit joins to an adjacent conduit in an adjacent conduit unit. Also, if an infinite number of conduit units were joined, it would be seen that each opening 13A in each conduit unit connects, by way of a plurality of conduits in a plurality of intervening conduit units, to an opening 13B in another conduit unit.

While a conduit unit has been illustrated as having two levels, a conduit unit may have any number of levels. Alternatively, multiple conduit units can be stacked on top of each other to create a system with any number of levels (or any even number of levels if the illustrated two-level conduit unit is used).

Advantageously, the illustrated two-level conduit unit provides loops, i.e., pathways provided in both directions (e.g., in one direction along the X axis on Level A and in the opposite direction along the X axis on Level B). Such loops can provide improved reliability over systems in which pathways are provided in only one direction. For instance, if a failure occurs in the data pathway in one direction, a data pathway in the other direction remains. Thus, if some failure or other event occurred in a pathway in Level A, a pathway in Level B would provide a redundant pathway into each cabinet in the opposite direction.

As used herein, the term "conduit unit" may refer to any set of main conduits of any number and length, and aligned by any means to create an angle with respect to the longitudinal axis of the conduit unit (i.e., the X axis in the illustrated in FIGS. 10A-11B). A conduit unit may, but does not necessarily, comprise two or more levels (e.g., Levels A and B described herein), for example, angled in opposite manners as illustrated in FIGS. 10A-11B, or two or more pairs of such levels. In addition, a conduit unit may, but does not necessarily, comprise articulated and/or divergent conduit(s), as described herein. Furthermore, a conduit unit may comprise any number of components to achieve the arrangement of main conduit(s), articulated conduit(s), and/or divergent conduit(s). For example, each conduit unit may be implemented as a single, integrated (e.g., injection-molded) unit or a plurality of units that are joined together into the described arrangements (e.g., each conduit may be a separate unit that is aligned by any alignment apparatus, such as the modules in the first embodiment described above). In addition, a conduit unit may be of any length, including, for example, the length of a single cabinet, less than the length of a single cabinet, the length of one-and-a-half cabinets, the length of two or more cabinets, or an arbitrary length unrelated to the length of a cabinet.

In an embodiment, any number of conduit units, regardless of how the alignment of conduits in each conduit unit is achieved, may be fixed or otherwise joined together by any well-known mechanism (e.g., screws, adhesive, brackets, pins, grooves, etc.).

In an embodiment, a plurality of conduit units can be arranged into a single conduit block. The conduit units of a conduit block may be arranged in any manner. However, it should be understood that if conduit blocks will be joined together, each conduit block to be joined should have the same arrangement of conduit units. In this manner, the openings in the conduit units in each conduit block will join together with adjacent openings in adjacent conduit units in an adjacent conduit block in the same manner as illustrated in FIGS. 11A and 11B.

Figure 12A:
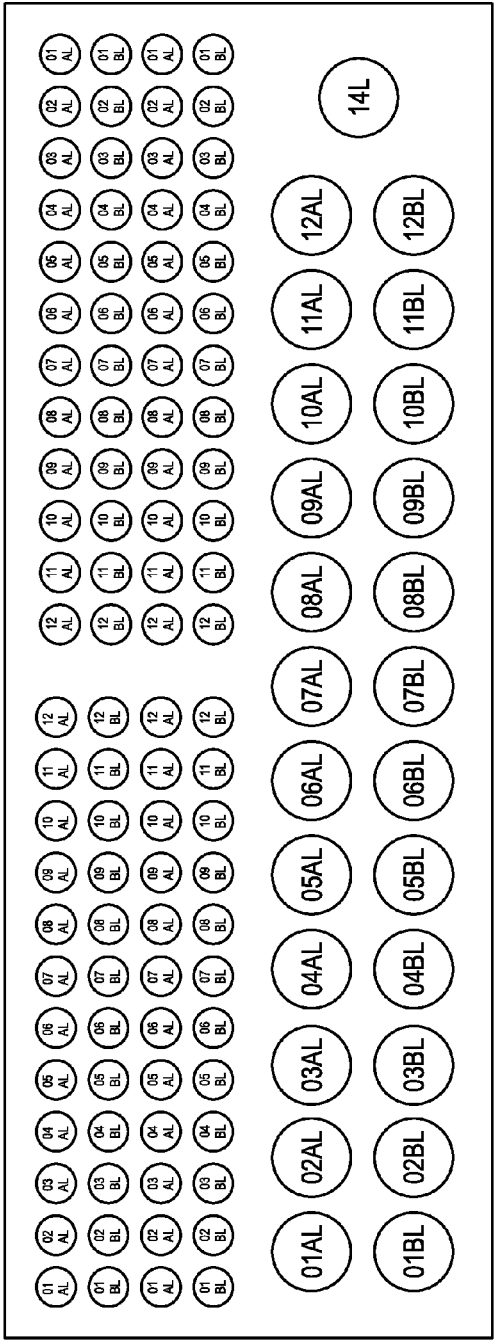
FIGS. 12A-12D illustrate relevant surfaces of a conduit block, comprising multiple conduit units, according to an embodiment.

FIG. 12A illustrates surface L of an example conduit block, according to an embodiment. The illustrated conduit block has four conduit units, each comprising conduits of a smaller diameter (e.g., one inch), on the top, one conduit unit, comprising conduits of a larger diameter (e.g., two inches), on the bottom, and one additional conduit of the larger diameter (e.g., two-inches) on the bottom.

The additional conduit on the bottom may be used, for example, to connect two cabinets on opposite ends of a row of cabinets. For example, the additional conduit may provide an isolated, independent conduit between two networking and/or electrical cabinets positioned on opposite ends of a row of data cabinets.

Figure 12B:
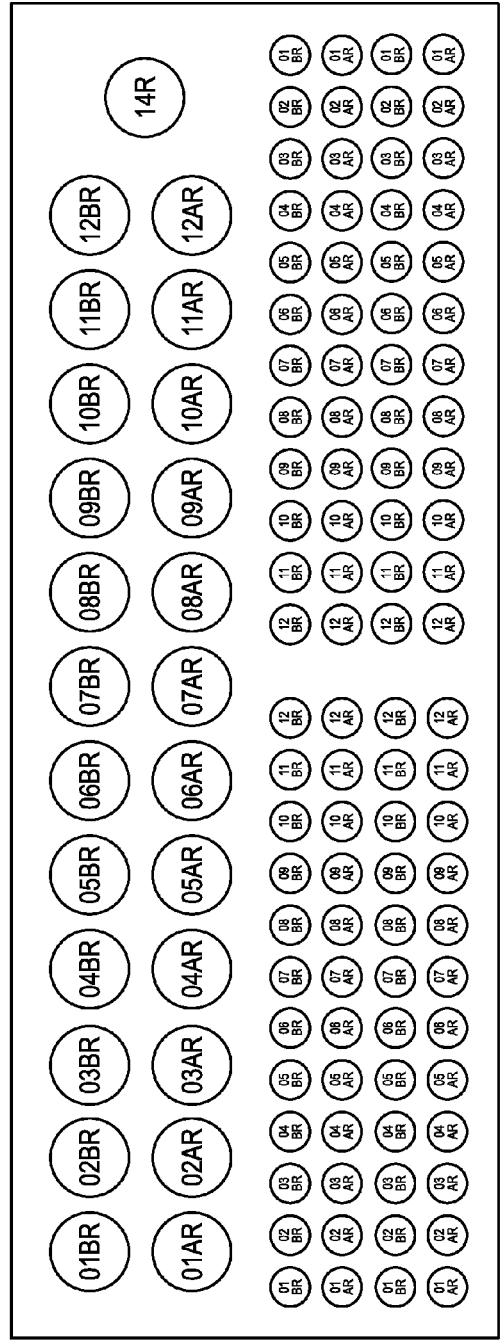

FIG. 12B illustrates surface R of the example conduit block illustrated in FIG. 12A, according to an embodiment. Surface R is the mirror image of surface L.

Figure 12C:
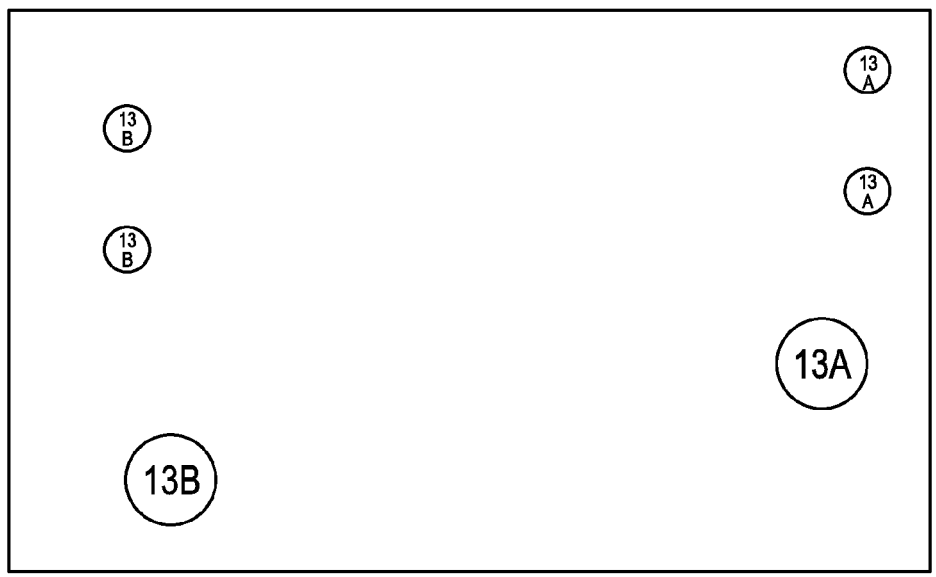

FIG. 12C illustrates surface S of the example conduit block illustrated in FIGS. 12A and 12B, according to an embodiment.

Figure 12D:
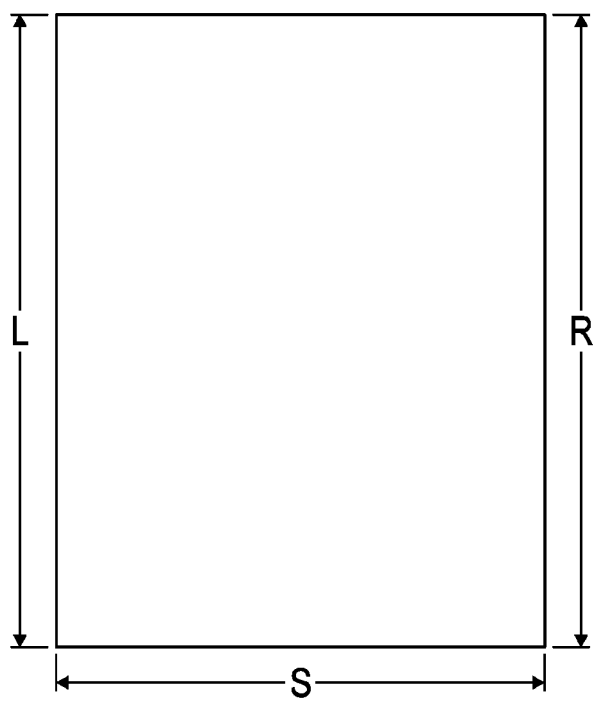

FIG. 12D illustrates a top or bottom surface of the conduit block illustrated in FIGS. 12A-12C, depicting the relationship of surfaces L, R, and S to each other, according to an embodiment.

Figure 13A:
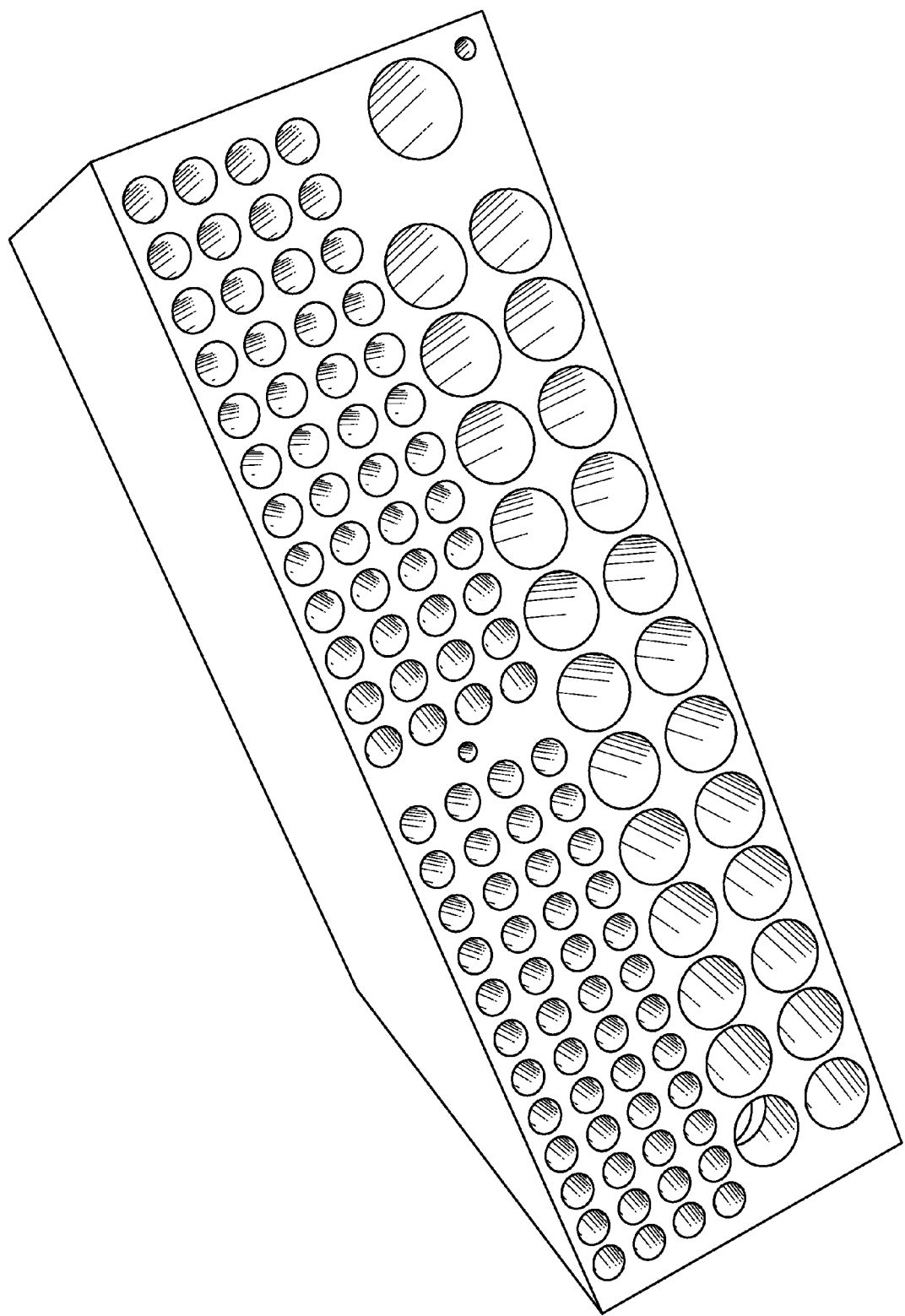
FIGS. 13A-13C illustrate perspective views of an embodiment of the conduit block illustrated in FIGS. 12A-12D, according to an embodiment.
Figure 13B:
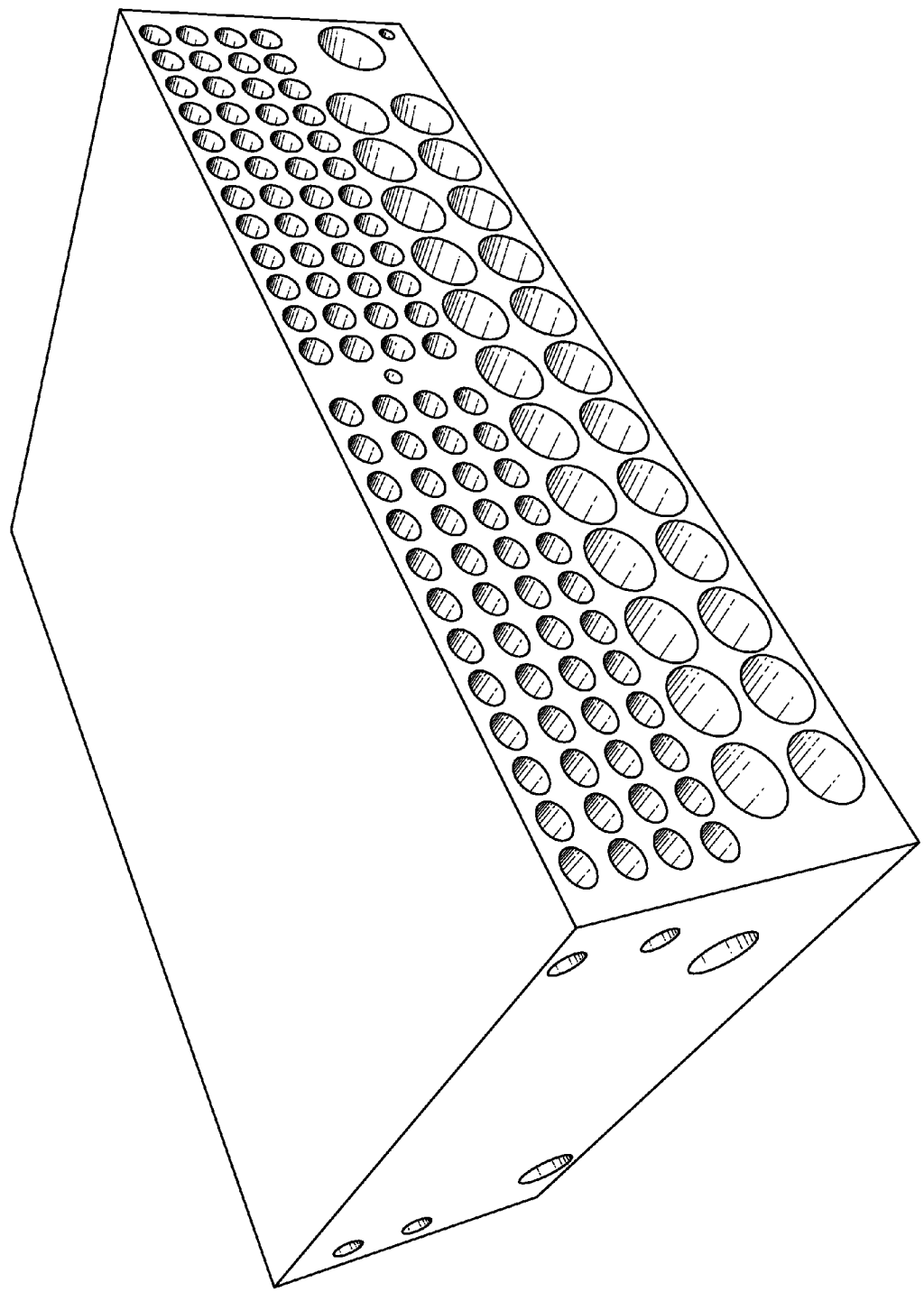
Figure 13C:
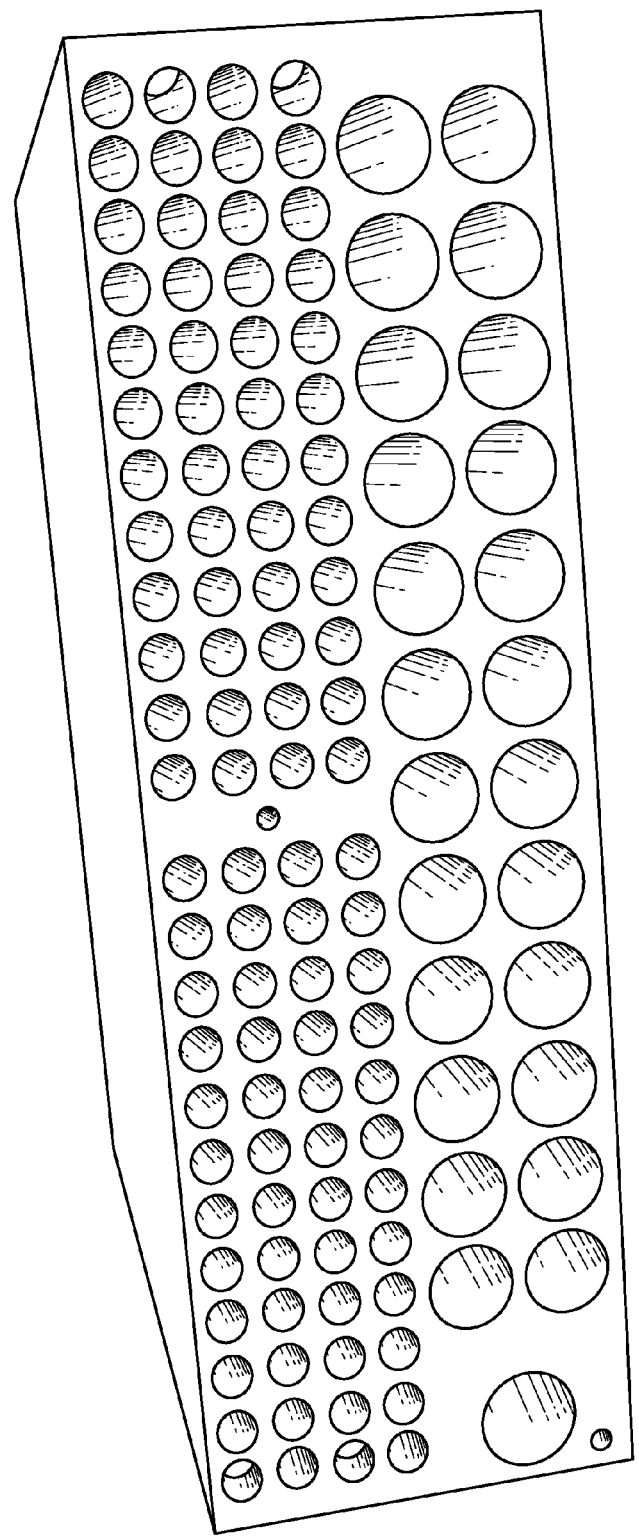

FIGS. 13A-13C illustrate perspective views of the example conduit block in FIGS. 12A-12D.

While, FIGS. 12A-13C illustrate a particular arrangement of conduit units within a single conduit block, an infinite number of other arrangements are possible. The permutations are unlimited with respect to the number of cabinets that may be placed in a row, the number and type of conduits provided to each cabinet, whether to place the system of conduit blocks above or below a row of cabinets, etc.

The particular embodiment illustrated in FIGS. 12A-13C is designed to support twenty-four data cabinets in a single row by being placed under the row of cabinets, and uses only ten inches of height underneath the cabinets.

In an embodiment, the illustrated design calls for one networking cabinet and one electrical cabinet on each end of the row of cabinets, bringing the total number of cabinets to twenty-eight. Each and every one of the twenty-four data cabinets will be supplied by ten independent and isolated conduit runs. Four one-inch networking runs are provided for each of the two networking cabinets, and one two-inch electrical run is provided for each of the two electrical cabinets. In the embodiment, all of the networking conduit entrances become accessible at the bottom of the networking cabinets, and the electrical conduits are extended through the bottom of the networking cabinets to become accessible at the bottom of the electrical cabinets. This system enforces redundancy by terminating half of the conduits out one side of the row and the other half of the conduits out the other side of the row.

In the illustrated embodiment of FIGS. 12A-13C, there is one additional two-inch conduit run 14L-14R, which, when provided in a plurality of conduit blocks, provides an isolated, independent conduit that runs the entire length of the row of cabinets. In an alternative embodiment, there are two or more such additional conduits. These two or more additional conduits may be stacked one on top of another, or arranged in any other manner, adjacent or not adjacent to each other. In an embodiment with at least two of these additional conduits, one of the additional conduits may be used to connect the two networking cabinets together, and the other one of the additional conduits may be used to connect the two electrical cabinets together.

Each conduit block may be sized to correspond to the size of the cabinets for which they will be utilized. For example, the top or bottom surface of the conduit block may be designed to be the same shape and size as the top and bottom surface of a standard cabinet.

In an embodiment, each conduit block may be fixed to a cabinet by means of well-known mechanisms (e.g., screws, adhesive, brackets, pins, grooves, etc.), and each conduit block may be fixed to an adjacent conduit block by the same or different mechanisms (e.g., screws, adhesive, brackets, pins, grooves, etc.).

To summarize, in a second embodiment, an apparatus may comprise: a conduit unit comprising a first level and a second level, wherein, each of the first level and the second level comprises a plurality of openings on a first surface of the conduit unit and a plurality of openings on a second surface of the conduit unit that is opposite the first surface, wherein the plurality of openings on each of the first surface and the second surface are arranged in a row parallel to a first axis, and wherein each of the plurality of openings on the first surface is opposite to exactly one of the plurality of openings on the second surface, a plurality of main conduits between the first surface and the second surface, wherein each of the plurality of main conduits comprises a through passage for one or more cables, wherein each of the plurality of main conduits is parallel to each of the other plurality of main conduits, and wherein each of the plurality of main conduits is angled with respect to a second axis that intersects both the first surface and the second surface and that is orthogonal to the first axis, such that each of the plurality of main conduits connects one of the plurality of openings on the first surface to one of the plurality of openings on the second surface that is adjacent within its row to the one opening on the second surface that is opposite to that one opening on the first surface, a divergent conduit that connects one of the plurality of openings on one of the first surface or the second surface to an opening on a third surface of the conduit unit, and an articulated conduit that connects one of the plurality of openings on one of the first surface or the second surface to an opening on the other one of the first surface or the second surface of the other level of the conduit unit, wherein the articulated conduit is angled with respect to a third axis that is orthogonal to the first axis and the second axis.

For each of the first level and the second level, the one of the plurality of openings connected by the articulated conduit may be on a different one of the first surface or the second surface than the one of the plurality of openings connected by the divergent conduit. The one of the plurality of openings connected by the articulated conduit may be at a terminal end of its row, and the one of the plurality of openings connected by the divergent conduit may be at a terminal end of its row.

The apparatus may further comprise at least one conduit block that comprises the conduit unit. The at least one conduit block may comprise a plurality of conduit units, including at least a first conduit unit and a second conduit unit. The first conduit unit may comprise first and second levels comprising a different number of main conduits than the first and second levels of the second conduit unit. The first conduit unit may comprise first and second levels comprising main conduits having a different diameter than the main conduits of the first and second levels of the second conduit unit. The at least one conduit block may be fixed to an outside surface of a cabinet. The at least one conduit block may comprise a first surface that comprises all of the first surfaces of its plurality of conduit units, and a second surface that comprises all of the second surfaces of its plurality of conduit units.

The apparatus may comprise a plurality of conduit blocks. Each of the plurality of conduit blocks may comprise a first surface that comprises all of the first surfaces of its plurality of conduit units, and a second surface that comprises all of the second surfaces of its plurality of conduit units. Two or more of the plurality of conduit blocks may be aligned in a row such that each of the plurality of openings on the first surface of one of the two or more conduit blocks provides a pathway to one of the plurality of openings on the second surface of an adjacent one of the two or more conduit blocks.

The first surface of one or more of the plurality of conduit blocks may be fixed to the second surface of an adjacent one of the plurality of conduit blocks. Each of the plurality of conduit blocks may further comprise an additional conduit that connects one of the plurality of openings in the first surface of the conduit block to the opposite one of the plurality of openings in the second surface of the conduit block. Two or more of the plurality of conduit blocks may be aligned in a row such that the opening to the additional conduit on the first surface of one of the two or more conduit blocks provides a pathway to the opening to the additional conduit on the second surface of an adjacent one of the two or more conduit blocks. The plurality of conduit blocks may be aligned in a row such that the additional conduits in the plurality of conduit blocks provide an isolated conduit run between a first one of the plurality of conduit blocks on one end of the row of conduit blocks and a second one of the plurality of conduit blocks on an opposite end of the row of conduit blocks.

Each of the plurality of conduit blocks may be fixed to an outside surface of a cabinet. Each of the plurality of conduit blocks may be fixed to an outside surface of a different cabinet that is arranged in a row of cabinets. Each of the plurality of conduit blocks may be fixed to a bottom surface of a cabinet.

The above description of the disclosed embodiments is provided to enable any person skilled in the art to make or use the invention. Various modifications to these embodiments will be readily apparent to those skilled in the art, and the general principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the art and that the scope of the present invention is accordingly not limited.

What is claimed is:

1. An apparatus comprising:
   a conduit unit comprising a first level, a second level, and an articulated conduit;
   wherein each of the first level and the second level comprises
      a plurality of openings in a first surface of the conduit unit and a plurality of openings in a second surface of the conduit unit that is opposite the first surface, wherein the plurality of openings in each of the first surface and the second surface are arranged in a row parallel to a first axis, and wherein each of the plurality of openings in the first surface is opposite to exactly one of the plurality of openings in the second surface,
      a plurality of main conduits between the first surface and the second surface, wherein each of the plurality of main conduits comprises a through passage for one or more cables, wherein each of the plurality of main conduits is parallel to each of the other plurality of main conduits, and wherein each of the plurality of main conduits is angled with respect to a second axis that intersects both the first surface and the second surface and that is orthogonal to the first axis, such that each of the plurality of main conduits connects one of the plurality of openings in the first surface to one of the plurality of openings in the second surface that is adjacent within its row to the one opening in the second surface that is opposite to that one opening in the first surface, and
      a divergent conduit that connects one of the plurality of openings in one of the first surface or the second surface to an opening in a third surface of the conduit unit, wherein the third surface is orthogonal to and extends between the first surface and the second surface; and
   wherein the articulated conduit connects one of the plurality of openings in one of the first surface or the second surface to an opening in the other one of the first surface or the second surface of the other one of the first level or the second level of the conduit unit, wherein the articulated conduit is angled with respect to a third axis that is orthogonal to the first axis and the second axis.

2. The apparatus of claim 1, wherein, for each of the first level and the second level, the one of the plurality of openings connected by the articulated conduit is in a different one of the first surface or the second surface than the one of the plurality of openings connected by the divergent conduit.

3. The apparatus of claim 1, wherein, for each of the first level and the second level, the one of the plurality of openings connected by the articulated conduit is at a terminal end of its row.

4. The apparatus of claim 1, wherein, for each of the first level and the second level, the one of the plurality of openings connected by the divergent conduit is at a terminal end of its row.

5. The apparatus of claim 1, further comprising at least one conduit block that comprises the conduit unit.

6. The apparatus of claim 5, wherein the at least one conduit block comprises a plurality of conduit units, including at least a first conduit unit and a second conduit unit.

7. The apparatus of claim 6, wherein the first conduit unit comprises first and second levels comprising a different number of main conduits than the first and second levels of the second conduit unit.

8. The apparatus of claim 6, wherein the first conduit unit comprises first and second levels comprising main conduits having a different diameter than the main conduits of the first and second levels of the second conduit unit.

9. The apparatus of claim 5, wherein the at least one conduit block is adapted to be fixed to an outside surface of a cabinet.

10. The apparatus of claim 5, wherein the at least one conduit block comprises a first surface that comprises all of the first surfaces of its plurality of conduit units, and a second surface that comprises all of the second surfaces of its plurality of conduit units.

11. The apparatus of claim 5, comprising a plurality of conduit blocks.

12. The apparatus of claim 11, wherein each of the plurality of conduit blocks comprises a first surface that comprises all of the first surfaces of its plurality of conduit units, and a second surface that comprises all of the second surfaces of its plurality of conduit units.

13. The apparatus of claim 12, wherein two or more of the plurality of conduit blocks are aligned in a row such that each of the plurality of openings in the first surface of one of the two or more conduit blocks provides a pathway to one of the plurality of openings in the second surface of an adjacent one of the two or more conduit blocks.

14. The apparatus of claim 12, wherein the first surface of one or more of the plurality of conduit blocks is adapted to be fixed to the second surface of an adjacent one of the plurality of conduit blocks.

15. The apparatus of claim 12, wherein each of the plurality of conduit blocks further comprises an additional conduit that connects one of the plurality of openings in the first surface of the conduit block to the opposite one of the plurality of openings in the second surface of the conduit block.

16. The apparatus of claim 15, wherein two or more of the plurality of conduit blocks are aligned in a row such that the opening to the additional conduit in the first surface of one of the two or more conduit blocks provides a pathway to the opening to the additional conduit in the second surface of an adjacent one of the two or more conduit blocks.

17. The apparatus of claim 16, wherein the plurality of conduit blocks are aligned in a row such that the additional conduits in the plurality of conduit blocks provide an isolated conduit run between a first one of the plurality of conduit blocks on one end of the row of conduit blocks and a second one of the plurality of conduit blocks on an opposite end of the row of conduit blocks.

18. The apparatus of claim 11, wherein each of the plurality of conduit blocks is adapted to be fixed to an outside surface of a cabinet.

19. The apparatus of claim 18, wherein each of the plurality of conduit blocks is adapted to be fixed to an outside surface of a different cabinet that is arranged in a row of cabinets.

20. The apparatus of claim 18, wherein each of the plurality of conduit blocks is adapted to be fixed to a bottom surface of a cabinet.

* * * * *